United States Patent
Xu et al.

(10) Patent No.: US 9,824,662 B2
(45) Date of Patent: Nov. 21, 2017

(54) THIN FILM TRANSISTOR ARRAY SUBSTRATE AND LIQUID CRYSTAL DISPLAY APPARATUS THEREOF

(71) Applicant: BOE TECHNOLOGY GROUP CO., LTD., Beijing (CN)

(72) Inventors: Chao Xu, Beijing (CN); Chunfang Zhang, Beijing (CN); Yan Wei, Beijing (CN); Heecheol Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 351 days.

(21) Appl. No.: 13/948,338

(22) Filed: Jul. 23, 2013

(65) Prior Publication Data
US 2014/0092079 A1    Apr. 3, 2014

(30) Foreign Application Priority Data
Sep. 29, 2012   (CN) .......................... 2012 1 0374775

(51) Int. Cl.
G09G 3/36     (2006.01)
H01L 23/48    (2006.01)
G02F 1/1362   (2006.01)

(52) U.S. Cl.
CPC ..... *G09G 3/3696* (2013.01); *G02F 1/136286* (2013.01); *H01L 23/48* (2013.01); *G09G 2320/0209* (2013.01); *H01L 2924/0002* (2013.01)

(58) Field of Classification Search
CPC ......... G09G 3/3696; G09G 3/36; H01L 23/48
USPC ................................ 345/212, 211, 92, 96, 98
See application file for complete search history.

(56) References Cited

U.S. PATENT DOCUMENTS

| | | | | |
|---|---|---|---|---|
| 5,229,964 | A * | 7/1993 | Yamauchi | 365/189.16 |
| 7,643,000 | B2 * | 1/2010 | Cho | 345/98 |
| 8,044,911 | B2 * | 10/2011 | Chung | 345/98 |
| 2005/0001807 | A1 * | 1/2005 | Lee et al. | 345/92 |
| 2005/0001808 | A1 * | 1/2005 | Lee | 345/96 |
| 2010/0118016 | A1 * | 5/2010 | Fujimura | 345/211 |
| 2011/0102405 | A1 * | 5/2011 | Harada | 345/211 |

FOREIGN PATENT DOCUMENTS

CN   101004502 A   7/2007

OTHER PUBLICATIONS

First Chinese Office Action Appln. No. 201210374775.6; dated Aug. 5, 2014.

* cited by examiner

*Primary Examiner* — Fred Tzeng
(74) *Attorney, Agent, or Firm* — Ladas & Parry LLP

(57) ABSTRACT

The present disclosure provides a Thin Film Transistor Array Substrate and a Liquid Crystal Display apparatus thereof, and relates to the technical field of liquid crystal displaying. The Thin Film Transistor Array Substrate of the present disclosure includes a plurality of gate lines and a plurality of data lines, wherein regions surrounded by the gate lines and the data lines are pixel regions, and wherein a high level common voltage line being used when signal on the data line is at a low level and a low level common voltage lines being used when signal on the data line is at a high level are also arranged in parallel to the gate lines in each of the pixel regions. With the Thin Film Transistor Array Substrate of the present disclosure, the Greenish phenomenon in the existing liquid crystal display apparatus may be effectively solved.

10 Claims, 3 Drawing Sheets

THIN FILM TRANSISTOR ARRAY SUBSTRATE AND LIQUID CRYSTAL DISPLAY APPARATUS THEREOF

TECHNICAL FIELD OF THE DISCLOSURE

The present disclosure relates to the technical field of liquid crystal displaying, and particularly to a Thin Film Transistor Array Substrate and a Liquid Crystal Display apparatus thereof.

BACKGROUND

In recent years, liquid crystal display devices have been widely used in various electronic products by replacing conventional Cathode Ray Tube display, due to advantages such as thinness, light weight, low power consumption, no radiation, etc.

For most of existing liquid crystal display devices, a large amount of lines are internally arranged due to the requirement for light-emitting and mutual influences among signals on respective lines will cause voltage fluctuation, which may easily render pictures displayed on the liquid crystal display devices greening, that is, so-called Greenish phenomenon. In order to avoid such phenomenon, a method commonly used in array substrates of the prior art is to increase area of Vcom (common voltage) lines or arrange common voltage lines in matrix, but such method fails to achieve a significant effect.

SUMMARY

The embodiments of the present disclosure provide a Thin Film Transistor Array Substrate and a Liquid Crystal Display apparatus thereof to remove the Greenish phenomenon in the liquid display devices of the prior art.

The Thin Film Transistor Array Substrate according to an embodiment of the present disclosure includes a plurality of gate lines and a plurality of data lines, wherein regions surrounded by the gate lines and the data lines are pixel regions, and wherein a high level common voltage line being used when signal on the data line is at a low level and a low level common voltage line being used when signal on the data line is at a high level are also arranged in parallel to the gate lines in the pixel regions.

The embodiments of the present disclosure provide a liquid crystal display panel including the Thin Film Transistor Array Substrate according to any one of the above technical solutions.

Further, the high level common voltage line and the low level common voltage line are arranged at edge locations of two horizontal sides of the pixel region respectively.

Further, the liquid crystal display panel also includes a timing controller for supplying driving signals having different operational timings for the gate lines, the data lines and the common voltage lines in the thin film transistor array substrate respectively.

Further, the timing controller is connected to the gate lines, the data lines and the common voltage lines via a gate driver, a data driver and a common driver, respectively, the high level common voltage line is connected to a high level pin of the common driver, and the low level common voltage line is connected to a low level pin of the common driver.

Further, at least one printed circuit board PCB is also included, the timing controller is set on the printed circuit board, and the printed circuit board is connected to the display panel via the gate driver, the data driver and the common driver.

Further, the operational timing of the driving signal supplied to the data lines by the timing controller is opposite to the operational timing of the driving signal supplied to the high level common voltage line and the low level common voltage line by the timing controller.

The embodiments of the present disclosure provide a liquid crystal display apparatus including the liquid crystal display panel according to any one of the above technical solutions.

In embodiments of the present disclosure, a original single sequence of common voltage lines is modified into two sequences of high level common voltage lines and low level common voltage lines, the timing controller is used to supply the high level common voltage line and the low level common voltage line with operational timings and voltages opposite to those of the data line for operation, such that the low level common voltage line operates when the data line is at a high level and the high level common voltage line operates when the data line is at a low level, which reduces pulling-up and pulling-down functions of voltages of the data lines on voltages of the common voltage lines, achieves an effect of reducing the Greenish phenomenon; and the high level common voltage line and the low level common voltage line are arranged at edge locations of two horizontal sides of the pixel region to achieve an effect of increasing the aperture ratio.

DETAILED DESCRIPTION

The embodiments of the present disclosure provide a Thin Film Transistor Array Substrate and a Liquid Crystal Display apparatus thereof which are capable of removing the Greenish phenomenon in the existing liquid display apparatuses.

First of all, based on the above purposes, one of the embodiments of the present disclosure provides a Thin Film Transistor Array Substrate including a plurality of gate lines and a plurality of data lines, wherein regions surrounded by the gate lines and the data lines are pixel regions, and wherein a high level common voltage line being used when signal on the data line is at a low level and a low level common voltage line being used when signal on the data line is at a high level are also arranged in parallel to the gate lines in each of the pixel region.

Figure 1:
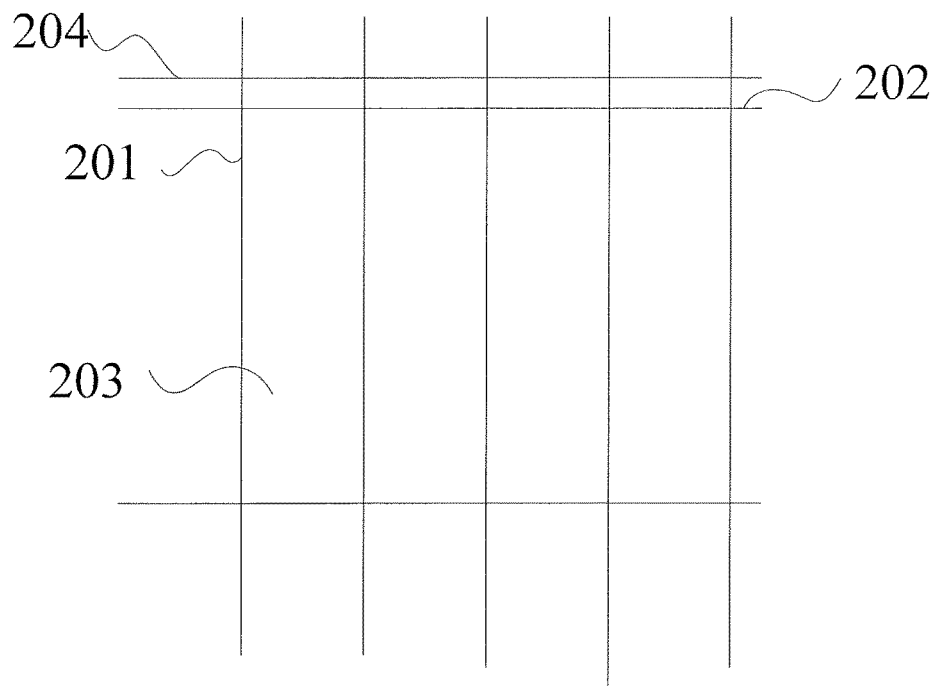
FIG. 1 is a schematic diagram of a structure of lines in the thin film transistor array substrate of the prior art.
Figure 2:
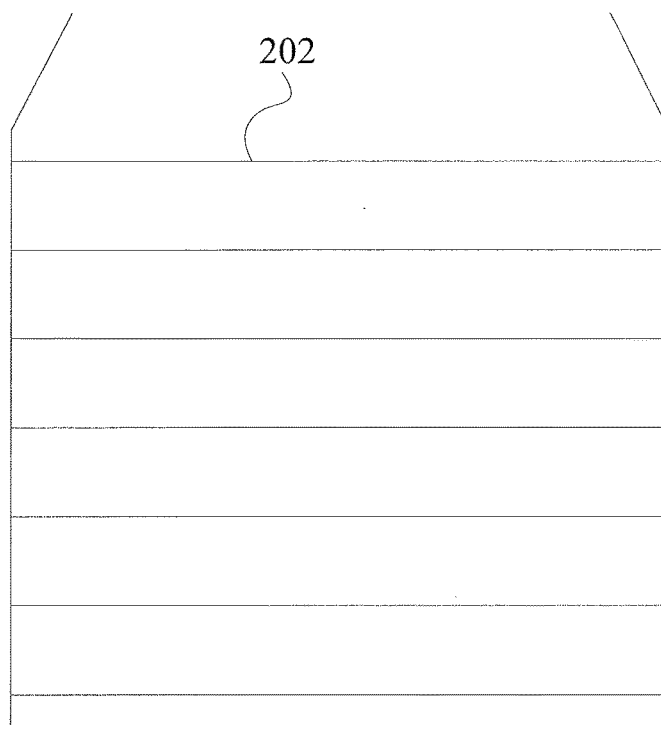
FIG. 2 is a schematic diagram of an arrangement of common voltage lines in the thin film transistor array substrate of the prior art.
Figure 3:
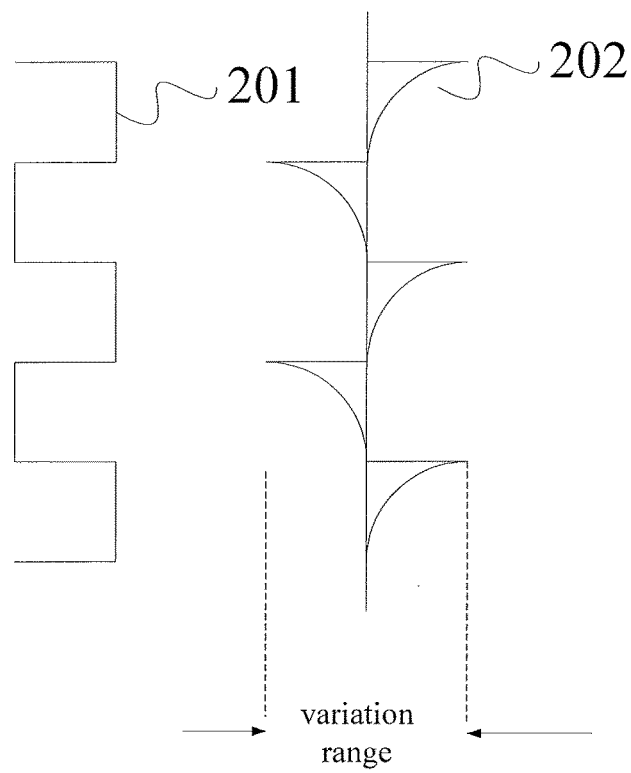
FIG. 3 is a schematic diagram of voltage variation of the common voltage lines affected by the data lines in the prior art.

A liquid crystal display device alters gray scales of pixels by changing signals on the gate lines and signals on the data lines, and finally makes the liquid crystal display representing a whole picture in combination with a color film substrate. As shown in FIG. 1 and FIG. 2, in a conventional Array substrate constituted by a plurality of gate lines 204 and a plurality of data lines 201, only one common voltage line 202 is set in each pixel region 203 and is largely affected by fluctuation in voltage signal on the data lines 201. As shown in FIG. 3, voltage signal on the common voltage line 202 is affected by voltage signal on the data lines 201 and has a large fluctuation range, and the larger fluctuation is, the more serious Greenish phenomenon is caused.

Figure 4:
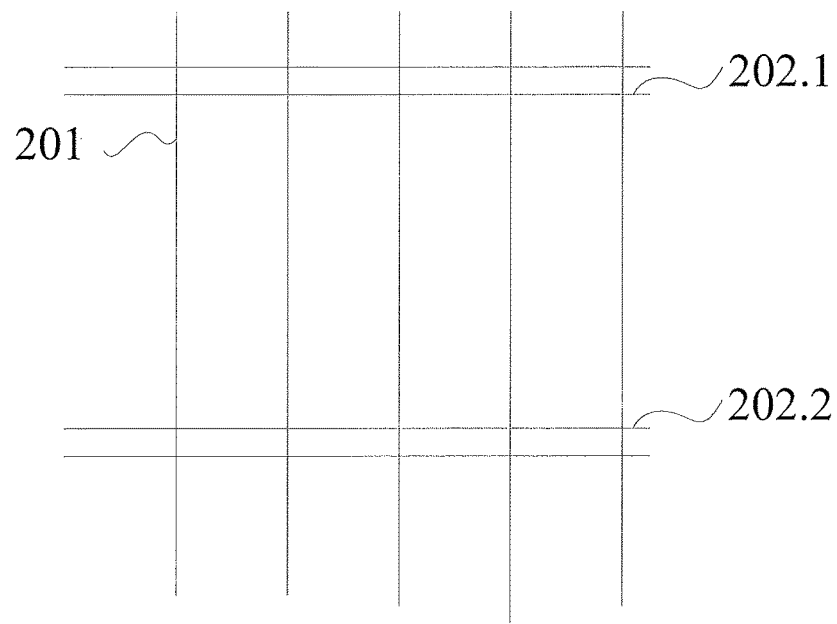
FIG. 4 is a schematic diagram of a structure of the lines in the thin film transistor array substrate provided in the embodiments of the present disclosure.
Figure 5:
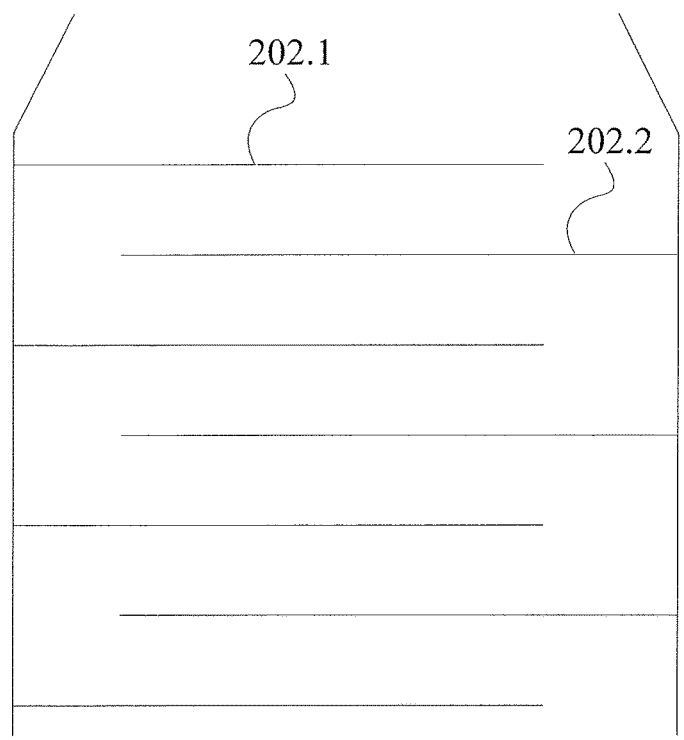
FIG. 5 is a schematic diagram of an arrangement of the common voltage lines in the thin film transistor array substrate provided in the embodiments of the present disclosure.
Figure 6:
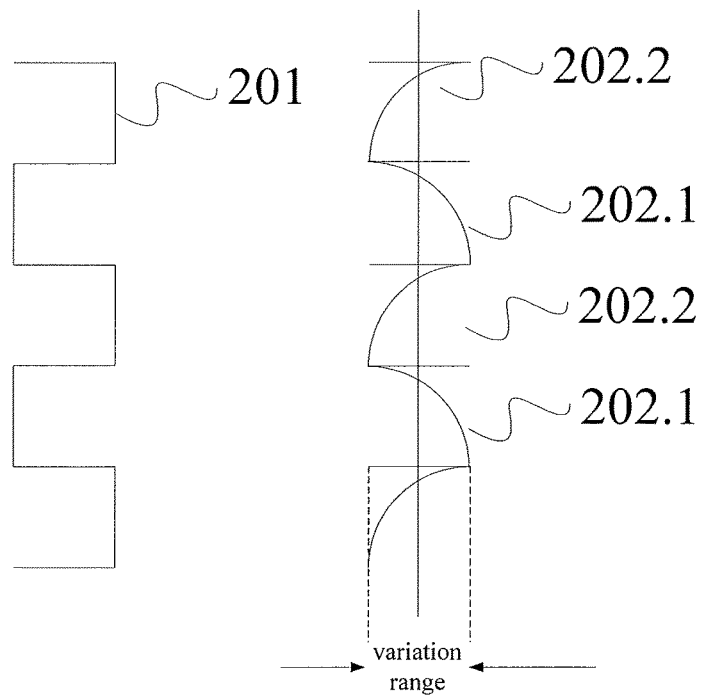
FIG. 6 is a schematic diagram of voltage variation of the common voltage lines affected by the data lines according to the embodiments of the present disclosure.

As shown in FIG. 4 and FIG. 5, in the embodiments of the present disclosure, a single common voltage line in the conventional Array substrate is divided into two common voltage lines and voltage signals are changed, wherein one common voltage line adopting a voltage higher than the voltage of the single common voltage line is called as a high level common voltage line 202.1, and another common voltage line adopting a voltage lower than the voltage of the single common voltage line is called as a low level common voltage line 202.2. A timing controller is used to perform an accurate control, the high level common line 202.1 operates when the voltage signal on the data line 201 is at a low level, and the low level common line 202.2 operates when the voltage signal on the data line 201 is at a high level. As shown in FIG. 6, after adopting the manner in which the high level common line 202.1 operates when the voltage signal on the data line 201 is at a low level and the low level common line 202.2 operates when the voltage signal on the data line 201 is at a high level, the high level common voltage line and the low level common voltage line operate alternatively such that the pulling-up and pulling-down functions of the voltage signal of the data lines are counteract, the fluctuation in the voltage signals on the common voltage lines is reduced, and the variation range of the voltage signals on the common voltage lines affected by the data lines is reduced thereby the Greenish phenomenon is reduced.

It should be noted that a voltage difference between the high level common voltage line and the single common voltage line shall be equal to the a voltage difference between the single common voltage line and the low level common voltage line when the single common voltage line is modified into the high level common voltage line and the low level common voltage line to better achieve the purpose for reducing the Greenish phenomenon. Particular voltage values can be set according to actual circumstance. A specific embodiment will be provided below.

EMBODIMENT

A prior liquid crystal display apparatus adopts a single sequence of common voltage lines of +5V, and a test shows that the fluctuation in the common lines caused by variation of voltage signals of the data lines is about 1V. Then, the single sequence is modified into two sequences of common voltage lines (the common voltage lines are duplicated), wherein voltage of high level common voltage lines is +6V and voltage of low level common voltage lines is +4V, and operational timings of the high level common voltage lines and the low level common voltage lines are matched preciously with that of the data lines by a control circuit, such that the low level common voltage line (+4V) operates when signal on the data line is at a high level; and the high level common voltage line (+6V) operates when signal on the data line is at a low level.

Furthermore, in order to increase the aperture ratio and decrease the power consumption, the high level common voltage line and the low level common voltage line are arranged at edge locations of two horizontal sides of the pixel regions of each row, respectively.

A signal voltage of the high level common voltage line shall be larger than a signal voltage of the low level common voltage line, and a sum of both is equal to twice of a signal voltage of an original single common voltage line.

The signal voltage of the original single common voltage line is set as a common electrode reference voltage, and a difference between the signal voltage of the high level common voltage line and the common electrode reference voltage is set in a predetermined range. The predetermined range can be set according to usage requirements, and particularly can be set in a range of ½₀-⅕.

A difference between the signal voltage of the low level common voltage line and the common electrode reference voltage is set in a predetermined range. The predetermined range can be set according to usage requirements, and particularly can be set in a range of ½₀-⅕.

Another embodiment of the present disclosure further provides a liquid crystal display panel including the Thin Film Transistor Array Substrate according to the above technical solutions, wherein the original single sequence of common voltage lines are modified into two sequences of common voltage lines, and two different operational timings and voltages are set so as to reduce the Greenish phenomenon.

A timing controller of the liquid crystal display apparatus is used to provide driving signals having different operational timings for the gate lines, the data lines and the common voltage lines in the thin film transistor array substrate, respectively. In order to achieve a better effect of reducing the Greenish phenomenon, the timing controller provides driving signals having opposite operational timings to the data lines and the common voltage lines via program controlling. That is to say, the timing controller supplies a low level signal to the common voltage lines when it supplies a high level signal to the data lines, and supplies a high level signal to the common voltage lines when it supplies a low level signal to the data lines. The purpose is to offset the pulling-up function of the data lines, reduce the fluctuation of the voltage signals on the common voltage lines, and reduce the variation range of the voltage signals on the common voltage lines affected by the data lines thereby reducing the Greenish phenomenon.

Generally, the timing controller is connected to the gate lines, the data lines and the common voltage lines via a gate driver, a data driver and a common driver, respectively. The respective drivers transfer the different driving signals controlled and separated by the timing controller to the gate lines, the data lines and the common voltage lines. In the embodiment of the present disclosure, in order to perform different operational timing controlling on the two common voltage lines, the common driver has two separate pins, the high level common voltage line is connected to a high level pin of the common driver, and the low level common voltage line is connected to a low level pin of the common driver.

The liquid crystal display panel further includes at least one printed circuit board PCB, on which the timing controller is set, and the printed circuit board is connected to the display panel via the gate driver, the data driver and the common driver.

The embodiment of the present disclosure further provides a liquid crystal display apparatus including the liquid crystal display panel according to any one of the above technical solutions, wherein the original single sequence of common voltage lines are modified into two sequences of common voltage lines, and two different operational timings and voltages are set for the two sequences so as to reduce the Greenish phenomenon.

The liquid crystal display apparatus has a signal input port which is connected to a driving signal input terminal of the timing controller. The timing controller separates and processes the input data signal and clock signal, and outputs corresponding driving signals to different drivers.

The liquid crystal display apparatus also has a power supply control circuit which is connected to the gate driver, the data driver, the common driver and the timing controller, respectively, and supplies power required for operating.

To sum up, in the present disclosure, the original single sequence of common voltage lines are change and two sequences of common voltage lines are used, and two different operational timings and voltages are set for the two sequences so as to reduce the Greenish phenomenon. The principle of the present disclosure can be easily understood and implemented, and has strong practicality and is worth of promotion.

Those skilled in the art should understand that the embodiments of the present disclosure can be implemented as a method, a system, or a computer program product. Therefore, the present disclosure can adopt the forms of a complete hardware embodiment, a complete software embodiment, or an embodiment combining hardware and software aspects. Moreover, the present disclosure may also adopt the form of a computer program product implemented on one or more computer usable storage media (include, but not limited to, magnetic disk storage and optical storage) in which computer usable program codes are contained.

The present disclosure has been described with reference to the flowchart and/or the block diagram of the method, the apparatus (system), and the computer program product of the embodiments of the present disclosure. It should be understood that the computer program instructions can implement each of the flow and/or block in the flowchart and/or block diagram, or any combination of the flows and/or blocks in the flowchart and/or block diagram. These computer program instructions can be provided to a general computer, a specific computer, an embedded processor or a processor in other programmable data processing devices to generate a machine, such that an apparatus for accomplishing functions as defined in one or more flows in the flowchart and/or one or more blocks in the block diagram is generated by the instructions executed by the computer or the processor in other programmable data processing devices.

These computer program instructions can also be stored in a computer readable storage which can guide a computer or other programmable data processing device to operate in a specific manner, such that the instructions stored in the computer readable storage can generate manufactured products including an instruction means which accomplishes functions as defined in one or more flows in the flowchart and/or one or more blocks in the block diagram.

These computer program instructions can also be loaded into computers or other programmable data processing devices, such that the computers or the other programmable data processing devices execute a series of operation steps to generate computer-accomplished processing, and thus the instructions executed on the computers or the other programmable data processing devices provide steps for accomplishing functions as defined in one or more flows in the flowchart and/or one or more blocks in the block diagram.

The above descriptions are only for illustrating the embodiments of the present disclosure, and in no way limit the scope of the present disclosure. It will be obvious that those skilled in the art may make modifications, variations and equivalences to the above embodiments without departing the spirit and scope of the present disclosure as defined by the following claims. Such variations and modifications are intended to be included within the spirit and scope of the present disclosure.

What is claimed is:

1. A Thin Film Transistor Array Substrate, including: a plurality of gate lines and a plurality of data lines, regions surrounded by the gate lines and the data lines are pixel regions, wherein the Thin Film Transistor Array Substrate further comprises:
   a high level common voltage line and a low level common voltage line disposed inside the pixel regions, the high level common voltage line and the low level common voltage line are in parallel to the gate lines and the high level common voltage line and the low level common voltage line are directly connected to the pixel region at edge locations of two horizontal sides of the pixel region respectively;
   the high level common voltage line is selected as a common electrode line when signal on the data line is at a low level; and
   the low level common voltage line is selected as the common electrode line when signal on the data line is at a high level.

2. The Thin Film Transistor Array Substrate of claim 1, wherein: a signal voltage of the high level common voltage line is larger than a signal voltage of the low level common voltage line, and a sum of both is equal to twice of a signal voltage of an original single common voltage line.

3. A liquid crystal display panel, including a Thin Film Transistor Array Substrate which comprises a plurality of gate lines and a plurality of data lines, regions surrounded by the gate lines and the data lines are pixel regions, wherein the Thin Film Transistor Array Substrate of the liquid crystal display panel further comprises:
   a high level common voltage line and a low level common voltage line disposed inside of the pixel regions, the high level common voltage line and the low level common voltage line are in parallel to the gate lines and the high level common voltage line and the low level common voltage line are directly connected to the pixel region at edge locations of two horizontal sides of the pixel region respectively;
   the high level common voltage line is selected as a common electrode line when signal on the data line is at a low level; and
   the low level common voltage line is selected as the common electrode line when signal on the data line is at a high level.

4. The liquid crystal display panel of claim 3, wherein: it further includes a timing controller for supplying driving signals having different operational timings for the gate lines, the data lines and the common voltage lines in the thin film transistor array substrate respectively.

5. The liquid crystal display panel of claim 4, wherein: the timing controller is connected to the gate lines, the data lines and the common voltage lines via a gate driver, a data driver and a common driver, respectively, the high level common voltage line is connected to a high level pin of the common driver, and the low level common voltage line is connected to a low level pin of the common driver.

6. The liquid crystal display panel of claim 5, further including at least one printed circuit board, wherein the timing controller is set on the printed circuit board, and the printed circuit board is connected to the display panel via the gate driver, the data driver and the common driver.

7. The liquid crystal display panel of claim 4, wherein: the operational timing of the driving signal supplied to the data line by the timing controller is opposite to the operational timing of the driving signal supplied to the high level common voltage line and the low level common voltage line by the timing controller.

8. A liquid crystal display apparatus, including a liquid crystal display panel which comprises a Thin Film Transistor Array Substrate, wherein the Thin Film Transistor Array Substrate comprises a plurality of gate lines and a plurality of data lines, regions surrounded by the gate lines and the data lines are pixel regions, wherein the Thin Film Transistor Array Substrate of the liquid crystal display apparatus further comprises:

a high level common voltage line and a low level common voltage line disposed inside the pixel regions, the high level common voltage line and the low level common voltage line are in parallel to the gate lines and the high level common voltage line and the low level common voltage line are directly connected to the pixel region at edge locations of two horizontal sides of the pixel region respectively;

the high level common voltage line is selected as a common electrode line when signal on the data line is at a low level; and the low level common voltage line is selected as the common electrode line when signal on the data line is at a high level.

9. The liquid crystal display apparatus of claim 8, wherein the liquid crystal display apparatus has a signal input port which is connected to a driving signal input terminal of the timing controller.

10. The liquid crystal display apparatus of claim 9, wherein the liquid crystal display apparatus also has a power supply control circuit which is connected to the gate driver, the data driver, the common driver and the timing controller, respectively.

* * * * *